US010951005B2

(12) United States Patent
Wang et al.

(10) Patent No.: US 10,951,005 B2
(45) Date of Patent: Mar. 16, 2021

(54) TECHNIQUES FOR ATTACHMENT AND ALIGNMENT OF OPTICAL COMPONENTS ON A THERMOELECTRIC COOLER (TEC) AND AN OPTICAL SUBASSEMBLY IMPLEMENTING SAME

(71) Applicant: Applied Optoelectronics, Inc., Sugar Land, TX (US)

(72) Inventors: Chong Wang, Stafford, TX (US); Kai-Sheng Lin, Sugar Land, TX (US); YongXuan Liang, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/506,587

(22) Filed: Jul. 9, 2019

(65) Prior Publication Data
US 2021/0013696 A1 Jan. 14, 2021

(51) Int. Cl.
*H01S 5/024* (2006.01)
*H04B 10/50* (2013.01)
*H01S 5/022* (2021.01)

(52) U.S. Cl.
CPC ...... *H01S 5/02415* (2013.01); *H01S 5/02272* (2013.01); *H01S 5/02288* (2013.01); *H04B 10/503* (2013.01)

(58) Field of Classification Search
CPC ............. H01S 5/02415; H01S 5/02272; H01S 5/02288; H01S 5/02476; H01S 5/02492; H01S 5/02236; H04B 10/503
See application file for complete search history.

(56) References Cited

U.S. PATENT DOCUMENTS

| | | | |
|---|---|---|---|
| 5,522,225 A | 6/1996 | Eskandari | |
| 6,556,752 B2 | 4/2003 | Fang et al. | |
| 9,379,518 B2 * | 6/2016 | Gao | H01S 5/042 |
| 2005/0045702 A1 * | 3/2005 | Freeman | H01L 35/30 |
| | | | 228/254 |
| 2016/0116694 A1 * | 4/2016 | Han | G02B 6/4271 |
| | | | 385/14 |

* cited by examiner

*Primary Examiner* — Armando Rodriguez
(74) *Attorney, Agent, or Firm* — Grossman Tucker Perreault & Pfleger, PLLC; Norman S. Kinsella

(57) ABSTRACT

In general the present disclosure is directed to a temperature control device, e.g., a TEC, that includes a top plate with at least first and second contact pads to allow for a soldering process to attach optical components to the first contact pad without causing one or more layers of the second contact pad to reflow and solidify with an uneven mounting surface. Thus, optical components such as a focus lens can be mounted to the second contact pad via, for instance, thermal epoxy. This avoids the necessity of a submount to protect the focus lens from the relatively high heat introduced during a soldering process as well as maintain the flatness of the second contact pad within tolerance so that the mounted focus lens optically aligns by virtue of its physical location/orientation with other associated optical components coupled to the first contact pad, e.g., a laser diode.

20 Claims, 14 Drawing Sheets

TECHNIQUES FOR ATTACHMENT AND ALIGNMENT OF OPTICAL COMPONENTS ON A THERMOELECTRIC COOLER (TEC) AND AN OPTICAL SUBASSEMBLY IMPLEMENTING SAME

TECHNICAL FIELD

The present disclosure relates to optical communications, and more particularly, to a thermoelectric cooler (or other temperature control device) with at least first and second contact pads which are thermally isolated from each other to allow for soldering of optical components to the first pad without causing the heat introduced during soldering to cause misalignment of components coupled to the second pad by reflowing and causing the second pad to solidify with an uneven mounting surface.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers. In general, ROSAs include a demultiplexer and one or more lenses to separate received channel wavelengths and convert the same into proportional electrical signals. Some applications requiring relatively long transmission distances can include a TOSA with a thermal management device such as thermoelectric cooler (TEC) to monitor channel wavelengths and heat/cool lasers to stabilize wavelengths and mitigate drift. TECs can include Peltier elements sandwiched between two ceramic plates/faces. Such TECs are generally designed with materials that provide a sufficient amount of thermal transfer to ensure wavelength stabilization.

BRIEF DESCRIPTION OF THE DRAWINGS

These and other features and advantages will be better understood by reading the following detailed description, taken together with the drawings wherein:

FIG. 11B shows the example thermoelectric cooler of FIG. 11A, in accordance with an embodiment.

FIG. 11C shows the example thermoelectric cooler of FIG. 11A, in accordance with an embodiment.

DETAILED DESCRIPTION

Figure 1A:
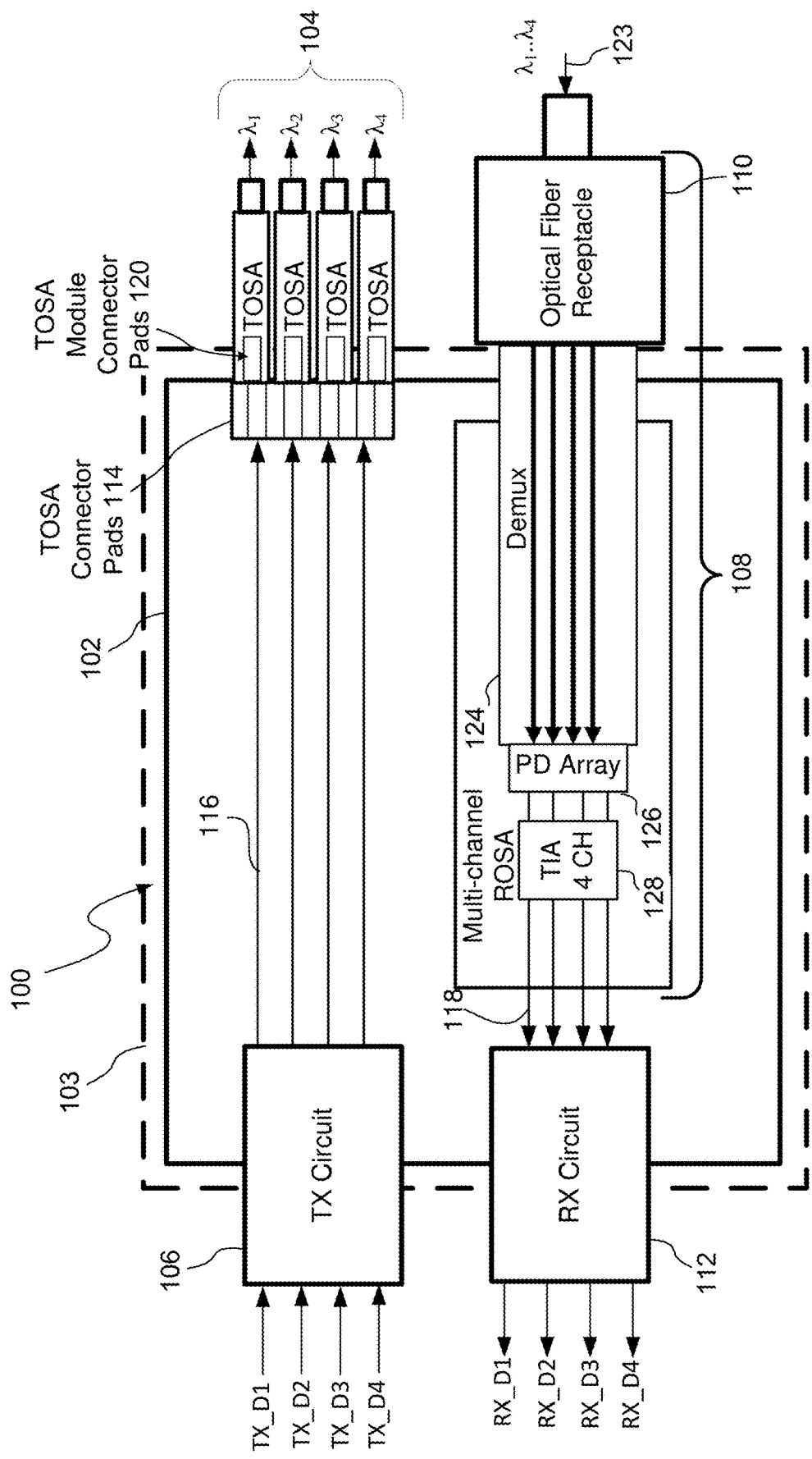
FIG. 1A is a block diagram of a multi-channel optical transceiver, consistent with embodiments of the present disclosure.

As discussed above, some optical transmission systems send and receive channel wavelengths over relatively long transmission distances, e.g., up to 2 km and beyond. The optical signal quality over such long distances therefore becomes important in order to maintain nominal performance. One approach to maintaining optical signal quality includes temperature control devices, e.g., thermoelectric coolers (TECs), in thermal communication with laser diodes (LDs) within transmitters/transceivers to maintain a nominal operating temperature and minimize or otherwise reduce wavelength drift.

Such TECs can include contact pads for mounting of optical components, e.g., laser diodes, monitor photodiodes, focus lens, and so on, via a soldering process. Soldering processes generally include a pre-tinning stage, whereby a soldering material such as a tin alloy is reflowed via application of heat, e.g., to reach the eutectic temperature, in order to cause the same to coat and adhere to a contact pad of the TEC. The contact pad of the TEC can be implemented as a metallic material or plate, such as Gold (Au) plating. Components may then be securely attached to the pre-tinned contact pad by heating the pre-tin layer and introducing additional solder material and flux to cause the same to adhere to the pre-tin layer. Formation of solder joints via this process can securely attach components to the TEC, as well as provide high structural reliability and high thermal communication between the TEC and the attached components, e.g., relative to other attachment processes such as using epoxy.

Existing TECs generally include a single contact pad that has a surface area substantially equal to the surface area of plate which the contact pad is disposed on. Put more plainly, existing TECs utilize a top surface with metallization that provides, essentially, a single contact pad. Pre-tinning therefore results in substantially all of the surface area of the mounting section of the TEC being coated with the pre-tin material. One challenge this raises is how to attach optical components, such as mirrors and/or lenses, that have a relatively low thermal tolerance and can become damaged during soldering processes. Submounts for temperature-sensitive components can mitigate the potential damage during soldering processes, but the reflowing of the pre-tin layer during soldering can result in a relatively uneven mounting surface after the pre-tin cools and transitions back to a solid phase. In any event, uneven mounting surfaces on a TEC resulting from pre-tin reflow can negatively impact optical subassembly performance by, for instance, introducing losses based on misalignment between associated optical components mounted to the TEC, e.g., between a laser diode and an associated focus lens.

In addition, such temperature control devices are often limited in thermal performance relative to the materials used to form the same. For instance, some TECs use Alumina for both top and bottom plates, and as a result, such TECs are capable of thermal conductivity of about 40 Watts per meter Kelvin (W/mK), e.g., at room temperature. On the other hand, Aluminum Nitride (AlN) provides thermal conductivity of about 180 W/mK or more in similar conditions. While such materials with high thermal conductivity significantly increase thermal performance, the relative increased cost of the materials significantly increases manufacturing costs. Accordingly, temperature control devices generally utilize relatively less-expensive, low thermal conductivity materials with the temperature regulation of LDs being accommodated in part by transmitter/transceiver designs which implement mitigating techniques to reduce load on temperature control devices.

Some such example configurations include isolating LDs away from associated components by disposing the LDs on dedicated submount(s), increasing heatsink dimensions, and providing relatively direct thermal conduction between heat-generating components and an associated housing. These mitigating techniques can assist in maintaining the temperature of LDs within a nominal operating range, but also decrease design flexibility and can necessitate including additional components in already space-constrained housings. Continued scaling and improvements in thermal performance of temperature control devices therefore depends at least in part on the development of temperature control devices that achieve relatively high thermal performance while still being manufactured in substantial part using highly-available, low-cost, low thermal conductivity materials, such as Alumina.

Thus, in general the present disclosure is directed to a temperature control device, e.g., a TEC, that includes a top plate (or cold side) with at least first and second contact pads to allow for a soldering process to attach optical components to the first contact pad without causing one or more layers of the second contact pad to reflow and solidify with potentially an uneven mounting surface. Thus, optical components such as a focus lens can be mounted to the second contact pad via, for instance, thermal epoxy. This avoids the necessity of a submount to protect the focus lens from the relatively high heat introduced during a soldering process as well as maintain the flatness of the second contact pad within tolerance so that the mounted focus lens is optically aligned by virtue of its physical location or otherwise disposed in a nominal orientation relative to other associated optical components coupled to the first contact pad, e.g., a laser diode.

In an embodiment, a thermoelectric cooler (TEC) is disclosed herein that includes a top plate or bottom plate being formed of a high thermal conductivity material, and the other of the top and bottom plate being formed of a low thermal conductivity material, with the high thermal conductivity material having a thermal conductivity at least twice, and preferably at least five times, that of the thermal conductivity of the low thermal conductivity material. In accordance with another embodiment, the top plate is formed of a low thermal conductivity material and the bottom plate is formed of a high thermal conductivity material. As discussed in further detail below, either the top or bottom plate may be formed of the high thermal conductivity material to advantageously accommodate a range of operating conditions. In any event, this difference in thermal conductivity of the resulting plates of a TEC may be referred to as plates with asymmetrical thermal performance. In this embodiment, the top plate can include two or more thermally isolated mounting sections, or may simply include a single mounting section.

In more detail, a temperature control device consistent with the present disclosure is implemented as a thermoelectric cooler (TEC) having a first plate (or a bottom plate), a second plate (a top plate), and a plurality of semiconductor elements, e.g., Peltier elements, disposed between the first and second plates. The top plate of the TEC provides at least one mounting surface for supporting optical components, e.g., an LD and associated circuitry, and the bottom plate of the TEC provides at least one mating surface to couple to a heatsink, such as the sidewall of the housing. The semiconductor elements adjustably facilitate thermal communication between the first and second plates, e.g., based on an applied electrical current, and provides at least one thermal conduction path between the at least one mounting surface and the heatsink.

In one embodiment, the top plate of the temperature control device is formed with at least 50%, and preferably 90-100%, of the overall weight of the top plate being a high thermal conductivity material (not including impurities). On the other hand, the bottom plate is formed with at least 50%, and preferably 90-100%, of the overall weight of the bottom plate being a low thermal conductivity material (not including impurities). In this embodiment, the high thermal conductivity material of the top plate has a thermal conductivity that it is at least twice the thermal conductivity of the low thermal conductivity of the bottom plate. This disclosure has identified that having the relatively higher thermal conductivity material in the top plate of a temperature control device facilitates thermal performance similar to that of a TEC with both top and bottom plates being formed of a high thermal conductivity material, e.g., at least 80 Watts per meter Kelvin (W/mK) at room temperature.

In addition, this disclosure has identified having a bottom plate formed of a relatively low thermal conductivity material, e.g., Aluminum Oxide (Al2O3), advantageously allows for matching of thermal expansion coefficients (CTEs) between the bottom plate and the heatsink/supporting structure. For instance, consider a scenario wherein an optical subassembly housing is formed of copper tungsten (CuW)

which has a CTE of about 6.5 to 8.5 parts per million per degree Celsius (ppm/° C.), and the bottom plate of the temperature control device (that is mounted to and supported by the optical subassembly housing) is formed of Aluminum Oxide (Al2O3) which has a CTE of about 8.1 ppm/° C. In this scenario the CTE between the optical subassembly housing and the bottom plate of the temperature control device is "matched" such that the difference is less than about 2 ppm/° C. In contrast, if the bottom and top plates of the temperature control device were both formed of a high-thermal conductivity material, such as Aluminum Nitride (AlN), then the resulting CTE would equal about 4.5 ppm/° C. Accordingly, such a temperature control device would have a CTE mismatch with an optical subassembly housing formed of CuW, with the resulting difference being 2.0 ppm in a best-case scenario and up to about 4.0 in a worst-case scenario. Such a difference in CTE can result in stress at the interface between the temperature control device and the supporting structure, and can ultimately result in stress fractures and/or a misalignment in optical light paths which can result in power loss. Thus, the present disclosure has identified that a temperature control device consistent with the present disclosure can increase thermal conductivity with optical components coupled thereto, e.g., by having a top plate formed of a high thermal conductivity material, and achieve a wide-range of operating temperatures without such power losses by having a bottom plate with a CTE that substantially matches materials commonly utilized to provide housings/heatsinks such as Copper Tungsten.

In one embodiment, the bottom plate of the temperature control device is formed with at least 50%, and preferably 90-100%, of the overall weight of the bottom plate being a high thermal conductivity material (not including impurities). On the other hand, the top plate is formed with at least 50%, and preferably 90-100%, of the overall weight of the top plate being a low thermal conductivity material (not including impurities). In this embodiment, the high thermal conductivity material of the bottom plate has a thermal conductivity that it is at least twice the thermal conductivity of the low thermal conductivity of the top plate. This disclosure has identified that having the relatively lower thermal conductivity material in the top plate of the temperature control device can act as a thermal insulator to maintain a target LD temperature. This disclosure has identified that the top plate acting as a thermal insulator, rather than a heat sink, can advantageously maintain the temperature of an LD in relatively cold environments, e.g., where the ambient temperature is −5 Celsius and below.

Accordingly, a TEC consistent with the present disclosure provides numerous advantages over other temperature control approaches. For example, the thermal load of the TEC may be increased, e.g., more components can be disposed thereon, by having a top plate formed of a material having high thermal conductivity, thus allowing for greater flexibility when designing optical transceivers/transmitters. This flexibility further allows for components to be closer together (e.g., co-located on a submount) or otherwise disposed in a configuration that accommodates space-constrained housings. In addition, the overall cost to manufacture each TEC, and thus by extension, the overall cost of the optical transceiver/transmitter may be significantly reduced.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Referring to the Figures, FIG. 1A illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

In an embodiment, the optical transceiver module 100 is disposed in a transceiver housing 103 or cage. The transceiver housing 103 can be configured with one or more cavities to receive and removably couple to one or more optical transceiver modules, such as N number of pluggable small form-factor (SFF) modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals on different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102.

The optical transceiver substrate 102 may include traces 116 that couple the TOSA connector pads 114 to the transmit connecting circuit 106. The optical transceiver substrate 102 may include traces 118 that electrically couple the ROSA arrangement 108 to the receiver connecting circuit 112. The optical transceiver substrate 102 may be manufactured from a multi-layer printed circuitry board (PCB), although other types of substrates may be utilized and are within the scope of this disclosure.

Each of the TOSA modules 104 may be configured to receive driving electrical signals (TX_D1 to TX_D4), convert the electrical signals to a multiplexed optical signal (e.g., a signal with channel wavelengths $\lambda 1 \ldots \lambda n$) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting components and circuitry such as focus lens, optical isolator and thermoelectric cooler (TEC). As discussed in greater detail below, each of the TOSA modules 104 can include a TEC (not shown in FIG. 1A) having top and bottom plates comprising different materials having substantially different (or asymmetric) thermal conductivity to increase or decrease thermal communication between the laser diode and a heatsink, e.g., the TOSA housing. The laser diode devices of the TOSA modules 104 may include distributed feedback lasers (DFBs), electro-absorption modulated lasers (EMLs), vertical external-cavity surface-emitting lasers (VECSEL) or other suitable laser devices.

As further in shown FIG. 1A, the multi-channel ROSA arrangement 108 includes an optical demultiplexer 124, a photodetector array 126 (e.g., photodiodes), and a trans-impedance amplifier (TIA) 128 or amplification circuit 128 for amplifying and converting optical signals into electrical signals.

In operation, the optical demultiplexer 124 receives the optical signal from the receive optical fiber 123 and then provides separated channel wavelengths from the same to the array of photodiodes 126. In turn, the array of photodiodes 126 converts the received channel wavelengths into an electrical signal and provides the same to the TIA 128. The TIA then amplifies and provides the receiver connecting circuit 112 with electrical signals (RX_D1 to RX_D4) corresponding to the received channel wavelengths. The receiver connecting circuit 112 is electrically connected to the electronic components (e.g., the laser, monitor photodiode, etc.) in the ROSA 108. The receiver connecting circuit 112 can include conductive paths to provide electrical connections and may also include additional circuitry.

Figure 1B:
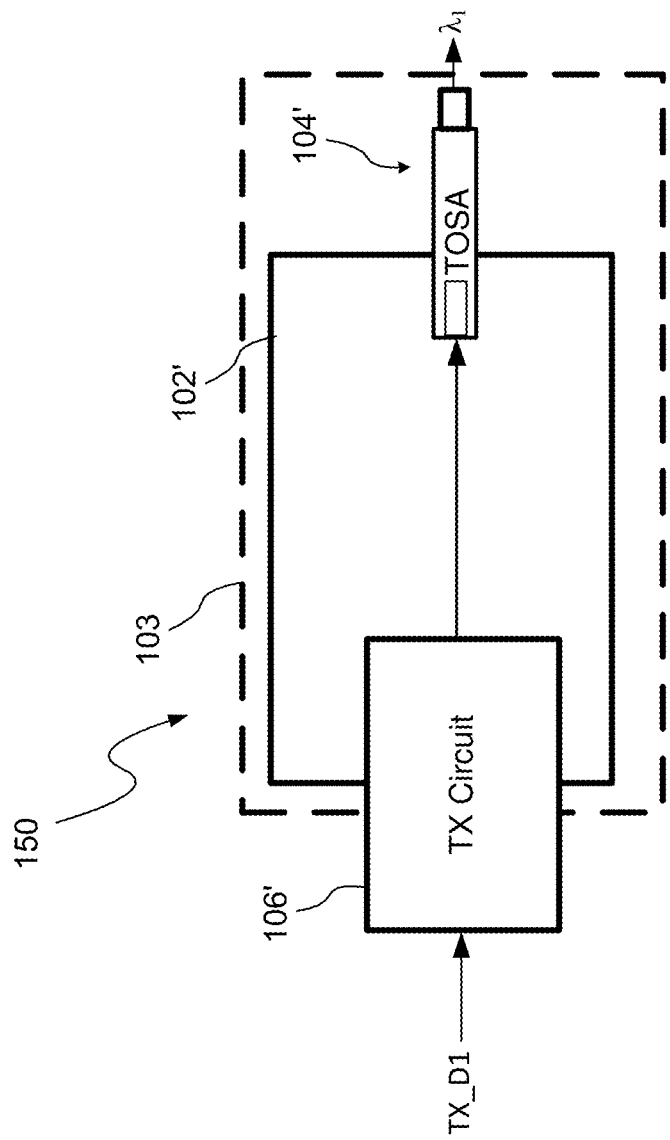
FIG. 1B is a block diagram of an optical transmitter module, consistent with embodiments of the present disclosure.

FIG. 1B shows an example optical transmitter module 150 consistent with an embodiment of the present disclosure. As shown, the optical transmitter module 150 includes a transmit connecting circuit 106' and TOSA 104' coupled to a substrate 102'. The optical transmitter module 150 may be removably coupled into, for instance, a cage 103. The transmit connecting circuit 106' can provide an electrical signal (TX_D1) to modulate the TOSA 104' and cause the same to emit an associated channel wavelength ($\lambda 1$). As discussed in greater detail below, the TOSA module 104' can include a TEC (not shown in FIG. 1B) having top and bottom plates comprising different materials having substantially different (or asymmetric) thermal conductivity.

Figure 2:
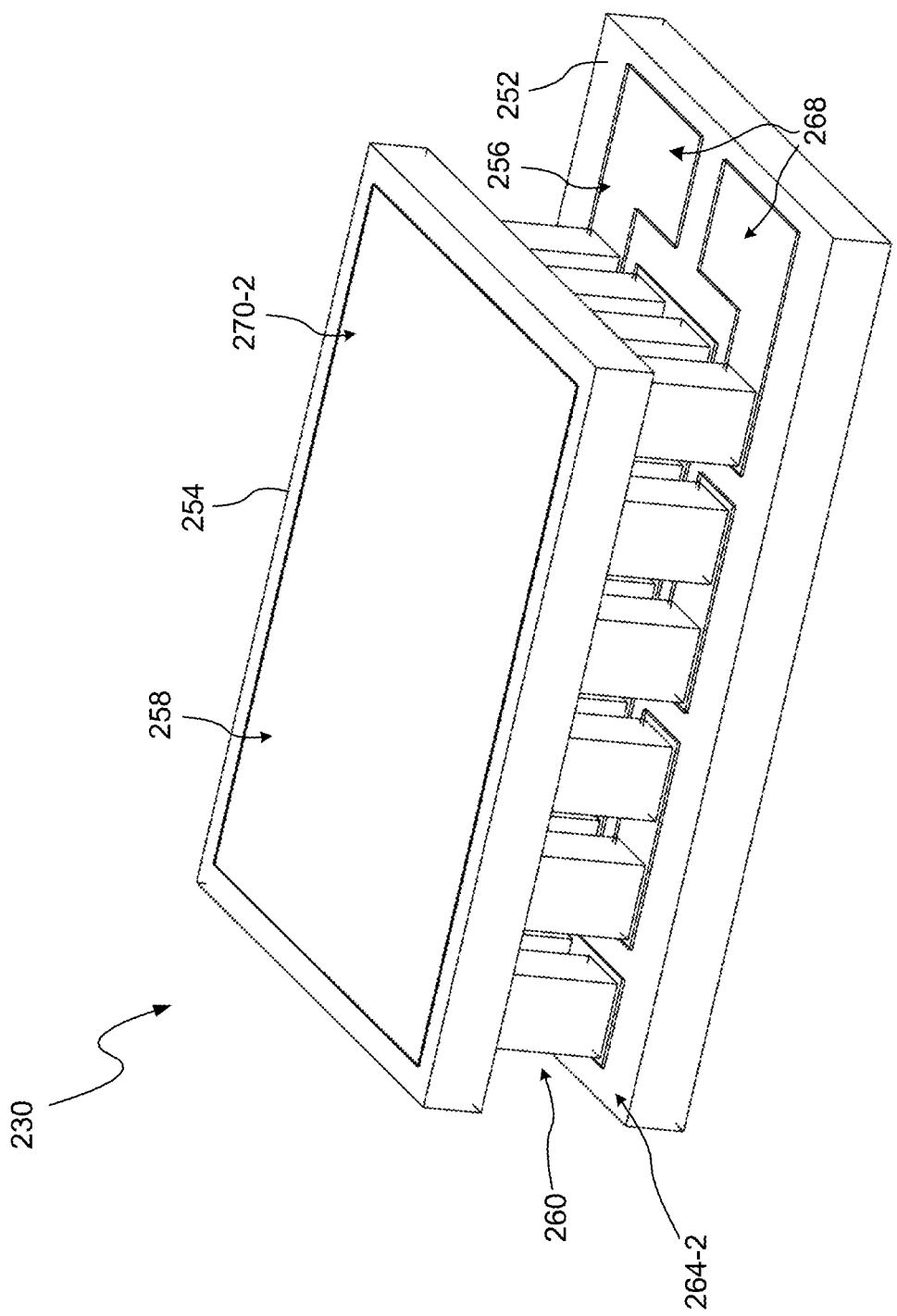
FIG. 2 is a perspective view of an example thermoelectric cooling device suitable for use in the multi-channel optical transceiver of FIG. 1A or the optical transmitter module of FIG. 1B, in accordance with embodiments of the present disclosure.
Figure 3:
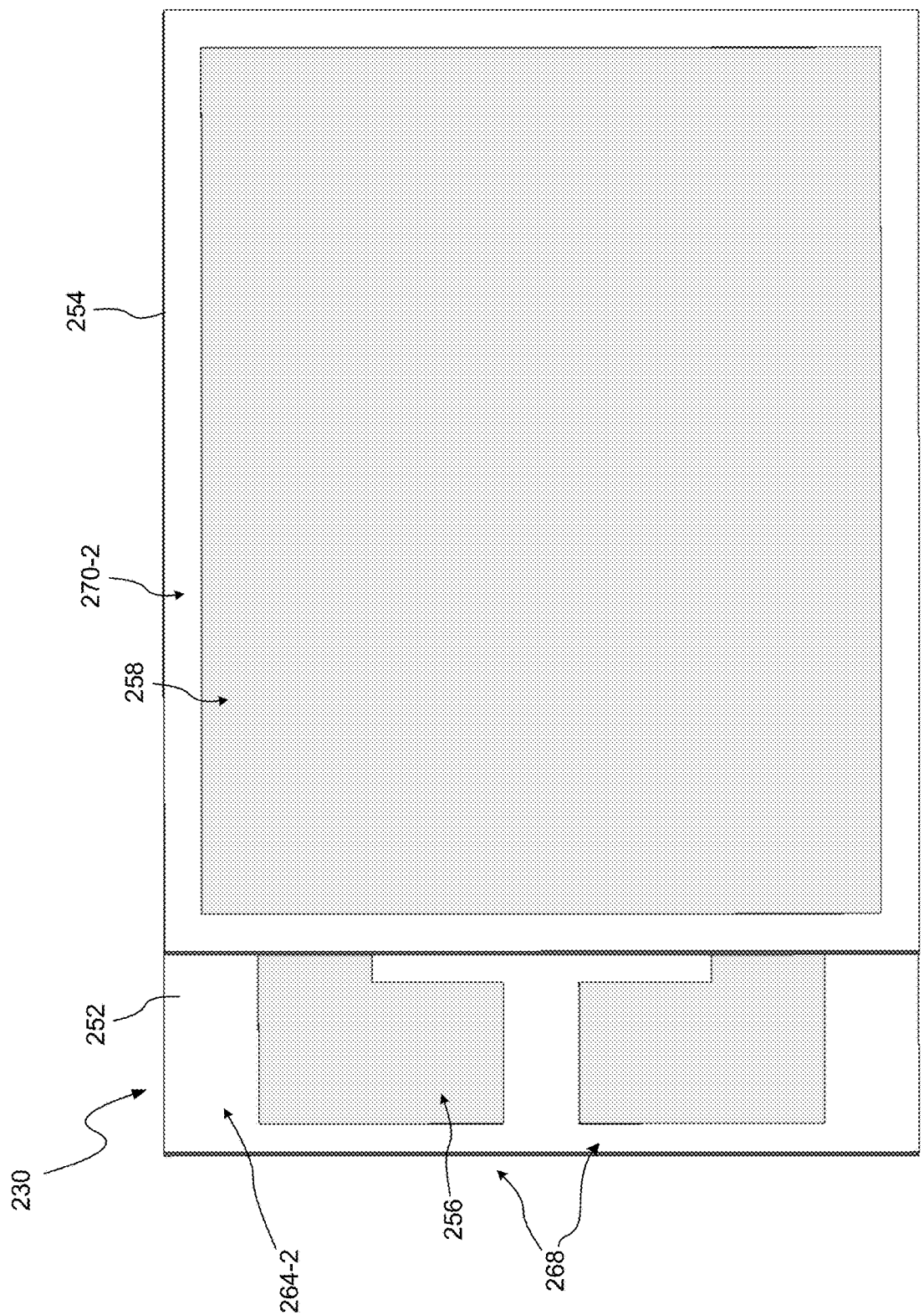
FIG. 3 shows a top-down view of the example thermoelectric cooling device of FIG. 2, in accordance with an embodiment.
Figure 4:
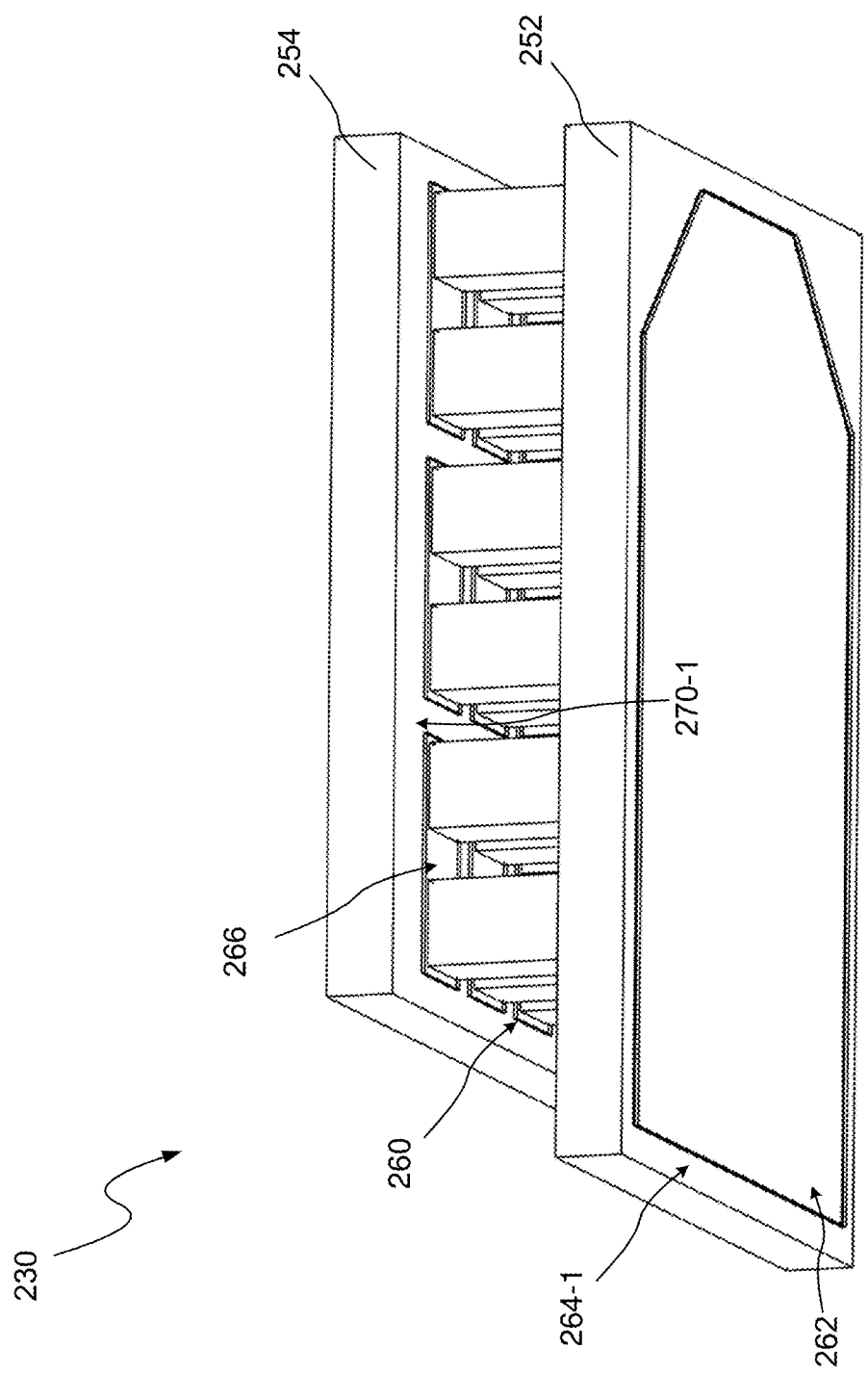
FIG. 4 is another perspective view of the example thermoelectric cooling device of FIG. 2, in accordance with an embodiment.
Figure 5:
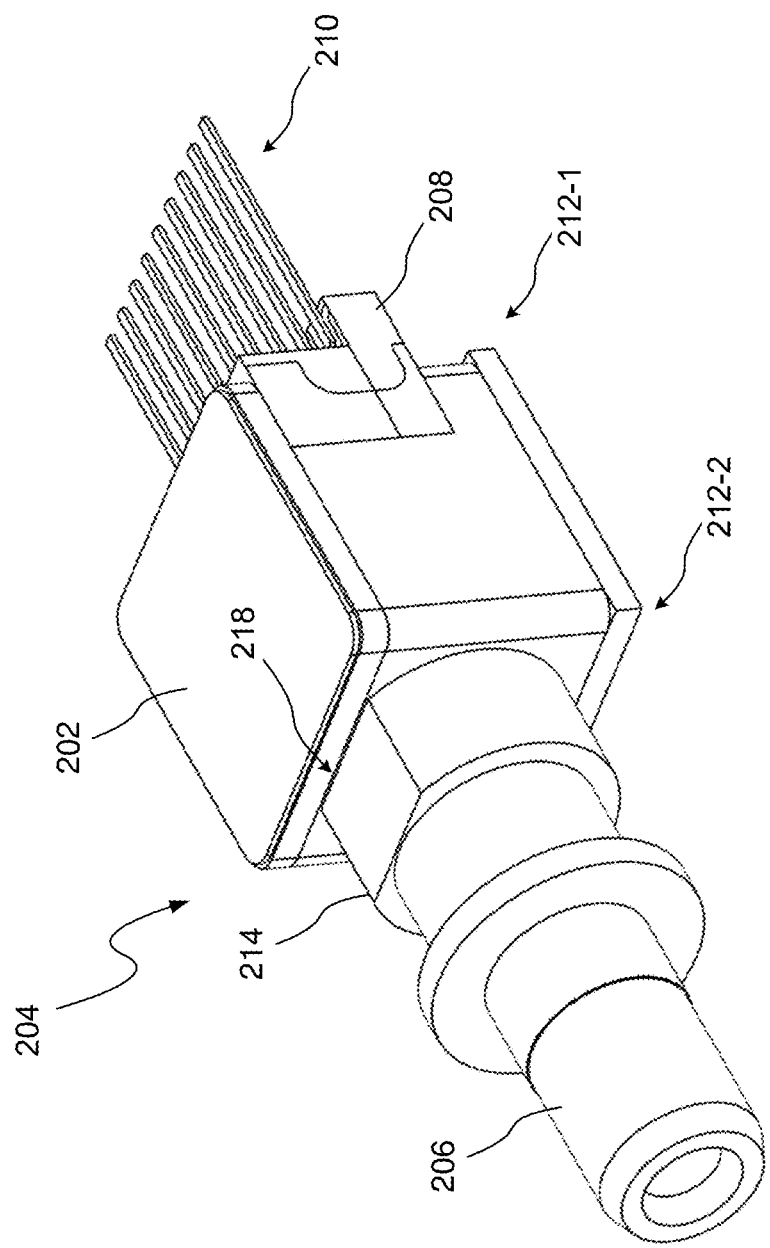
FIG. 5 shows a perspective view of an example transmitter module, in accordance with an embodiment of the present disclosure.
Figure 6:
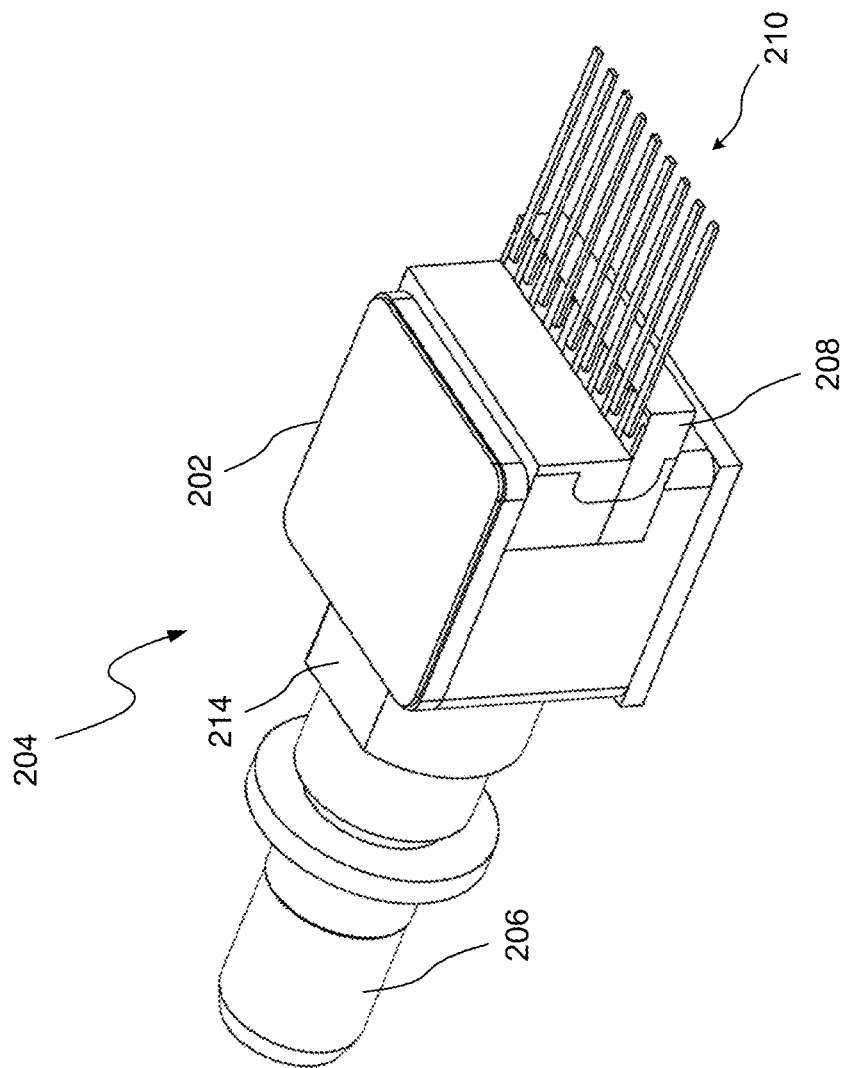
FIG. 6 shows another perspective view of the example transmitter module of FIG. 5, in accordance with an embodiment of the present disclosure.

Referring to FIGS. 2-4, an example thermoelectric cooler (TEC) 230 is shown consistent with embodiments of the present disclosure. As shown, the TEC 230 includes a bottom plate 252 (or first plate 252), a plurality of semiconductor elements (or devices) 260, and a top plate 254 (or second plate 254). The bottom plate 252 couples to a heatsink and the top plate 254 couples to and supports a laser arrangement, as discussed further below. In embodiments, the bottom plate 252 comprises a first material and the top plate 254 comprises a second material, wherein the first and second materials differ from one another. In particular, the first and second materials have different respective thermal conductivities. In specific examples, the thermal conductivity of one of the first and second material is at least twice that of the other of the first and second material. For example, the material having the relatively higher thermal conductivity may be at least five times greater than the thermal conductivity of the other material. For purpose of clarity the first and second materials may also be referred to as low and high conductivity materials, respectively. As used herein, the term "thermal conductivity" when used in conjunction with a material refers to thermal conductivity of the material at room temperature.

The first and second materials may be formed from or include any suitable materials. For example, the first and second materials may each be formed from or include one or more metals, ceramics, composites, combinations thereof, and the like. Without limitation, in embodiments the first material includes, or is, in the form of a material having a first thermal conductivity and the second material includes, or is, in the form of a material having a second thermal conductivity, wherein the second thermal conductivity is greater than the first thermal conductivity. For example, the second thermal conductivity may be at least about 2, 3, 4, 5 or even about 6 or more times greater than the first thermal conductivity. Put differently, the first material (of the bottom plate) may be in the form of, or include, one or more "low" thermal conductivity materials, and the second material (of the top plate) may be in the form of, or include, one or more "high" thermal conductivity materials, wherein the thermal conductivity of the low and high materials meets the aforementioned relationship. Without limitation, in embodiments the top plate is formed from or includes a high thermal conductivity material and the bottom plate is formed from, or includes, a low thermal conductivity material, wherein the thermal conductivity of the high the high thermal conductivity material is about 5 to about 6 times greater than the thermal conductivity of the low thermal conductivity material.

In embodiments the low thermal conductivity material has a thermal conductivity in the range of greater than 0 to about 50 Watts per meter Kelvin (W/mK), such as from about 10 to about 40 W/mK, or even from about 20 to about 40 W/mK. Non-limiting examples of suitable low thermal conductivity materials that may be used include alumina ($Al_2O_3$—also known as Alumina Oxide—thermal conductivity in the range of about 20 to about 30 W/mK), combinations thereof and the like. In some embodiments, the low thermal conductivity material is formed from or includes Alumina.

In contrast, the high thermal conductivity material may have a thermal conductivity in range of greater than or equal to about 70 W/mK, such as greater than about 100 W/mK, about 120 W/mK, about 140 W/mK, about 160 W/mK, about 180 W/mK, or even about 200 W/mK or more. Non-limiting examples of suitable high thermal conductivity materials that may be used include Aluminum Nitride (AlN—thermal conductivity of about 180 W/mK), Beryllium Oxide (BeO—room temperature thermal conductivity of about 285 W/mK).

In any such cases, the high and low conductivity material may be formed of any suitable metal, ceramic, composite, ceramic, or combination thereof so long as the high conductivity material has an associated thermal conductivity that is at least twice that of the low thermal conductivity material, and preferably, an associated thermal conductivity that is at least 5-6 times greater than that of the low thermal conductivity material. Accordingly, the bottom and top plates 252, 254 have asymmetric thermal performance/conductivity relative to each other.

In an embodiment, the bottom plate 252 is formed from a first material, wherein the first material includes from about 80 to about 99% of Alumina or Aluminum Nitride, relative to the total weight of the first material), and from about 1 to about 20% of other materials, such as one or more matrix/binder materials, impurities, or the like. The remainder of material of the bottom plate 252 can include any suitable material including impurities. In embodiments, bottom plate 252 is formed from a first material that includes from about 90 to about 99 weight % of Alumina and/or Aluminum Nitride, and from about 1 to about 10 weight percent other materials, such as one or more matrix/binder materials, impurities, or the like. In specific non-limiting embodiments, bottom plate 252 is formed from a first material that includes from 90 to 99% by weight of Aluminum Nitride, relative to the total weight of the first material.

In an embodiment, the top plate 254 is formed from a second material, wherein the second material includes from about 80 to about 99% of Alumina or Aluminum Nitride, relative to the total weight of the first material, and from about 1 to about 20% of other materials, such as one or more matrix/binder materials, impurities, or the like. The remainder of material of the top plate 254 can include any suitable material including impurities. In embodiments, the top plate 254 is formed from a second material that includes from about 90 to about 99 weight % Aluminum Nitride, and from about 1 to about 10 weight percent other materials, such as one or more matrix/binder materials, impurities, or the like. In specific non-limiting embodiments, top plate 254 is formed from a second material that includes from 90 to 99% by weight of Aluminum Nitride, relative to the total weight of the first material.

This disclosure has identified that having a top plate with high thermal conductivity and a bottom plate with a substantially lower thermal conductivity can sufficiently cool a laser assembly supported by the top plate. In one specific example, a TEC consistent with this embodiment has achieved temperature reductions of up to about 25 degree Celsius relative to the ambient temperature. This advantageously allows for a TEC consistent with the present disclosure to be constructed with one plate (e.g., the top plate) being formed from a more expensive, higher-thermal conducting material and the other plate (e.g., the bottom plate) to be formed from a relatively inexpensive material that has substantially less thermal performance.

Thus, in an embodiment, the bottom plate 252 is formed of a material having thermal conductivity that is at least twice, and preferably, at least five times of that of the thermal conductivity of the material forming the top plate 254. For example, in an embodiment, the top plate 254 is formed of a ceramic having 80-99 wt. % Alumina of the overall weight of the top plate 254, and preferably 90-99 wt. % Alumina of the overall weight of the top plate 254. In any such cases, the remainder of material of the top plate 254 can include any suitable material including impurities. In some cases, the top plate 254 is formed of a ceramic having 99-100 wt. % Alumina, including impurities. In this embodiment, the bottom plate 252 is a ceramic having 80-99 wt. % Aluminum Nitride of the overall weight of the bottom plate 252, and preferably 90-99 wt. % Aluminum Nitride of the overall weight of the bottom plate 252. Accordingly, this embodiment includes the base plate 252 that couples to the heat sink having a thermal conductivity that is three-times, and preferably, about six times the thermal conductivity of that of the top plate that couples to and supports the laser arrangement. Accordingly, this embodiment is particularly well suited for environments that are relatively cold, e.g., −5 degrees Celsius, with the reduced thermal conductivity of the top plate 254 acting as essentially thermal insulation to selectively keep heat generated by the associated laser arrangement from dissipating and ensuring that the associated laser to remains within a nominal operating temperature.

In any such cases, the bottom plate 252 is defined by a first substantially planer mounting surface 264-1 (See FIG. 4) disposed opposite a second substantially planer mounting surface 264-2. The first and second substantially planer mounting surfaces 264-1, 264-2 extend substantially parallel with each other, as shown, although other embodiments are within the scope of this disclosure. The first mounting surface 264-1 of the bottom plate 252 provides at least one mating face for thermally coupling with a heatsink, such as the sidewall of a TOSA housing. The first mounting surface 264-1 optionally includes a pad 262 disposed/formed thereon. The pad 262 may be formed via a metallization process and can comprise, for example, gold (Au) or other metal/metal alloy that provides a surface suitable for fixation to the heat sink via welding or soldering, for instance. The material of the pad 262 may be chosen based on a material having thermal conductivity that substantially matches that of the material forming the bottom plate 252.

Continuing on, the second mounting surface 264-2 includes a first plurality of traces 256 disposed thereon. The first plurality of traces 256 couple to and support the plurality of semiconductor elements 260, and importantly, provide an electrical junction therebetween to TEC 230 to thermally conduct according to the Peltier effect, as will be discussed in further detail below. The first plurality of traces 256 may comprise, for example, Gold (Au) or any other suitable metal/metal alloy.

As further shown, the top plate 254 is defined by a first substantially planer mounting surface 270-1 (See FIG. 4) disposed opposite a second substantially planer mounting surface 270-2 (FIG. 3). The first and second substantially planer mounting surfaces 270-1, 270-2 extend substantially parallel with each other, as shown, although other embodiments are within the scope of this disclosure. The first substantially planer mounting surface 270-1 includes a plurality of pads/terminals 266 disposed thereon. The plurality of pads/terminals 266 may comprise, for example, Gold (Au) although other metals and metal alloys are within the scope of this disclosure. The plurality of pads/terminals 266 allow the first substantially planer mounting surface 270-1 to couple to a second end of each of the plurality of semiconductor devices 260.

The plurality of semiconductor devices 260 coupled between the first and second plates 252, 254 can include a plurality of alternating P- and N-type Peltier devices. The plurality of semiconductor devices 260 can couple electrically in series and thermally in parallel.

The second mounting surface 270-2 provides one or more mounting surfaces for supporting a laser assembly (not shown), with the laser assembly including at least a laser diode and supporting circuitry. As shown, a pad 258 is disposed/formed on the second mounting surface 270-2. The pad 258 may comprise, for instance, Gold (Au) or other suitable metal or metal alloy. The laser diode and associated circuitry of the laser assembly can couple (e.g., directly or indirectly via a submount) to the pad 258 and be supported by the same. Thus, the laser diode and associated circuitry can be in thermal communication with the TEC by way of the pad 258.

As further shown, at least two leads/terminals 268 are formed by the first plurality of traces 256. The terminals 268 allow for the TEC 230 to be electrically coupled to, for instance, a temperature control system (not shown) and power source. During operation, current may be therefore induced into the TEC 230 by way of the terminals 268 to cause the TEC 230 to increase or decrease temperature, as the case may be. The terminals 268 may be exposed such that the top plate 254 does not extend over the same, e.g., based on the first and second plates 252, 254 not being coextensive with each other.

Turning to FIGS. 5-8, an example transmitter optical subassembly module (TOSA) 204 is shown consistent with embodiments of the present disclosure. The TOSA module 204 is suitable for use in an optical transceiver system of FIG. 1A or optical transmitter such as the optical transmitter module of FIG. 1B. The TOSA module 204 includes a housing 202 and an optical coupling receptacle 206.

Figure 8:
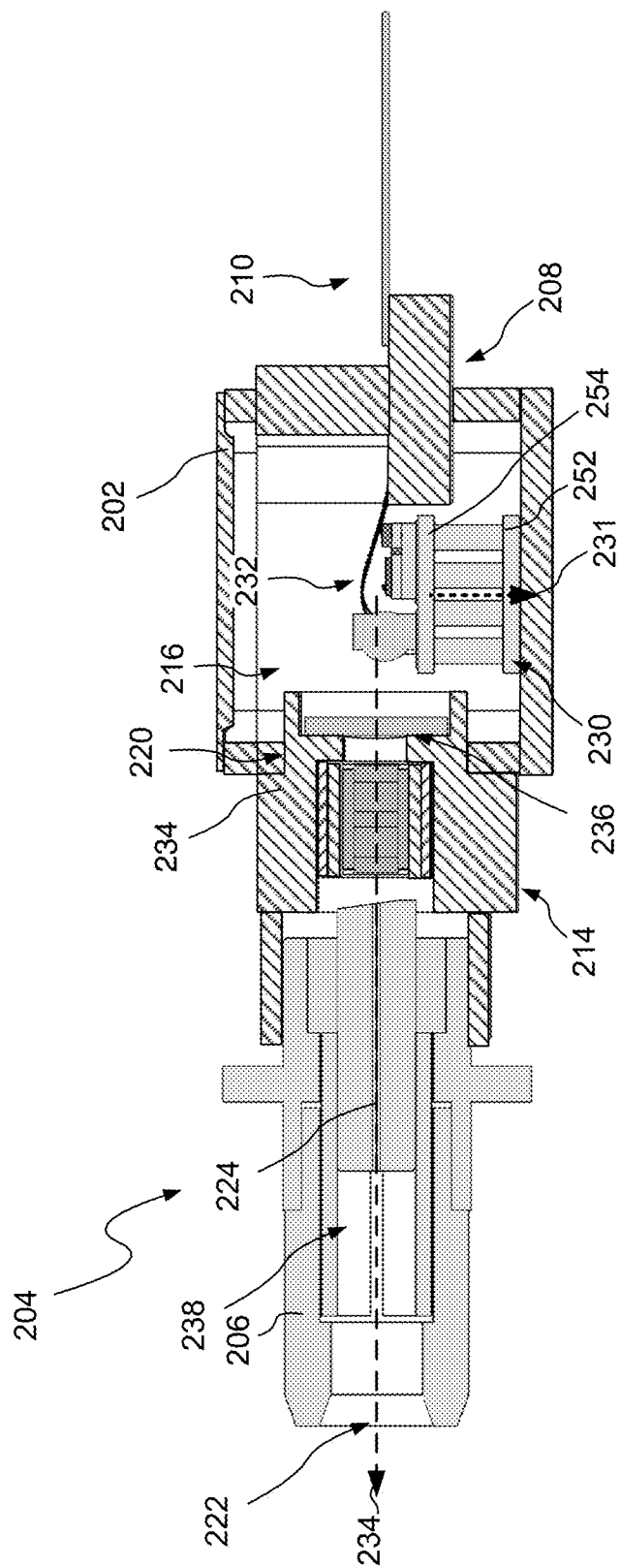
FIG. 8 shows a cross-sectional view of the example transmitter module of FIG. 7 taken along line 8-8, in accordance with an embodiment of the present disclosure.

In particular, the housing 202 includes a plurality of sidewalls that define a cavity 216 (See FIG. 8). The cavity may be hermetically-sealed, and thus, the example TOSA module 204 may also be referred to as a hermetically-sealed TOSA module or a hermetically-sealed light engine. However, other embodiments are within the scope of this disclosure and the cavity 216 may not necessarily be hermetically-sealed.

A first end 212-1 of the housing includes a feedthrough device 208 and a plurality of electrical leads/pins 210. The electrical leads/pins 210 can electrically couple to, for instance, the TOSA connecting pads 114 of the optical transceiver shown in FIG. 1A. The feedthrough device 208 thus provides electrical connectivity to provide power and radio frequency (RF) driving signals, e.g., from the transmit connecting circuit 106, to the optical components within the cavity 216 of the housing 202. A second end 212-2 of the housing 202, opposite the first end 212-1, includes a mounting region/receptacle for coupling to and securely holding the optical coupling receptacle 206 a predetermined position. The second end 212-2 includes an aperture 220 (see FIG. 8) to allow for optical components of the TOSA module 204 to optically couple to the optical coupling receptacle to launch channel wavelengths onto an external transmit fiber, for example. Accordingly, the first end 212-1 may therefore be referred to as an electrical coupling end and the second end 212-2 may be referred to as an optical coupling end.

The housing 202 may comprise, for example, a metal or metal alloy. In some cases, the housing 202 comprises a metal alloy comprising nickel, cobalt and iron commonly referred to as Kovar (e.g., ASTM F-15 alloy). Other metal and metal alloys are within the scope of this disclosure including non-metal materials that are suitably rigid.

Figure 7:
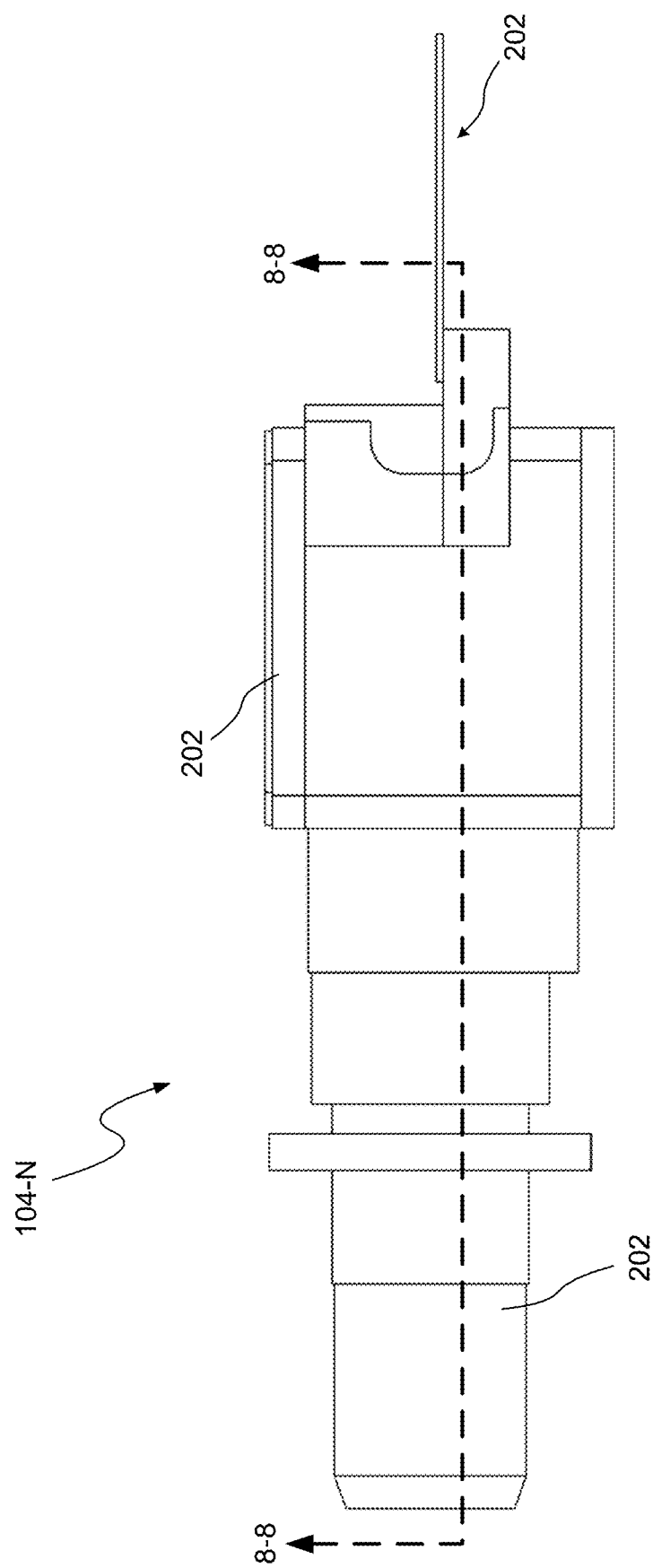
FIG. 7 shows a side view of the example transmitter module of FIG. 5, in accordance with an embodiment.

With specific reference to FIG. 8, a cross-sectional view of the example TOSA module 204 taken along line 8-8 of FIG. 7 is shown consistent with an embodiment of the present disclosure. As shown, the optical coupling receptacle 206 includes a first end with an opening/receptacle 222 to couple to, for example, a ferrule. The opening 222 then transitions to a cavity 238 that extends along the longitudinal length of the optical coupling receptacle 206 to provide a light path 234 therethrough. The optical coupling receptacle 206 further includes a fiber stub 224 within the cavity 238 following the opening 222.

As shown in FIG. 8, the TOSA housing 202 further includes a TEC 230 and a laser arrangement 232 supported by the same. The laser arrangement 232 is configured to emit associated channel wavelengths along light path 234. The TEC 230 is supported by a sidewall of the TOSA housing 202, with the TOSA housing providing, in a general sense, a heat sink to dissipate heat generated by the laser arrangement. To this end, the laser arrangement 232 is disposed on the top plate 254, with heat generated by the laser arrangement 232 following a thermal path shown generally at 231.

As further shown, the optical coupling receptacle 206 mechanically couples to the housing 202 via a coupler 214 (or coupler portion) of the housing 202. Note, the coupler 214 may be accurately considered as forming a portion of the housing 202. However, in other embodiments the coupler 214 may be a component of the optical coupling receptacle 206 itself. The coupler 214 of the housing 202 includes a body 214 with a first end for coupling/mating with the receptacle 222 and a second end for coupling/mating to the housing 202. At least a portion of the coupler 214 extends into the cavity 216 of the housing 202 and securely hold a window lens 236 in optical alignment with other optical components within the cavity 216 of the housing 202.

Referring to FIGS. 9-15 another example embodiment of a TEC 930 consistent with aspects of the present disclosure is shown. As shown, the TEC 930 includes a first plate (or bottom plate) 952, a second plate (or top plate 954), and a plurality of semiconductor elements 960. The first plate 952 includes a mating surface 966 for coupling the TEC 930 to a housing/heatsink. The TEC 930 further includes posts 961 for electrically coupling with associated circuitry within a TOSA housing. The TEC 930 may be configured substantially similar to the TEC 230 (See FIG. 2), the teachings and embodiments of which are equally applicable to the TEC 930 and will not be repeated for brevity.

Figure 10:
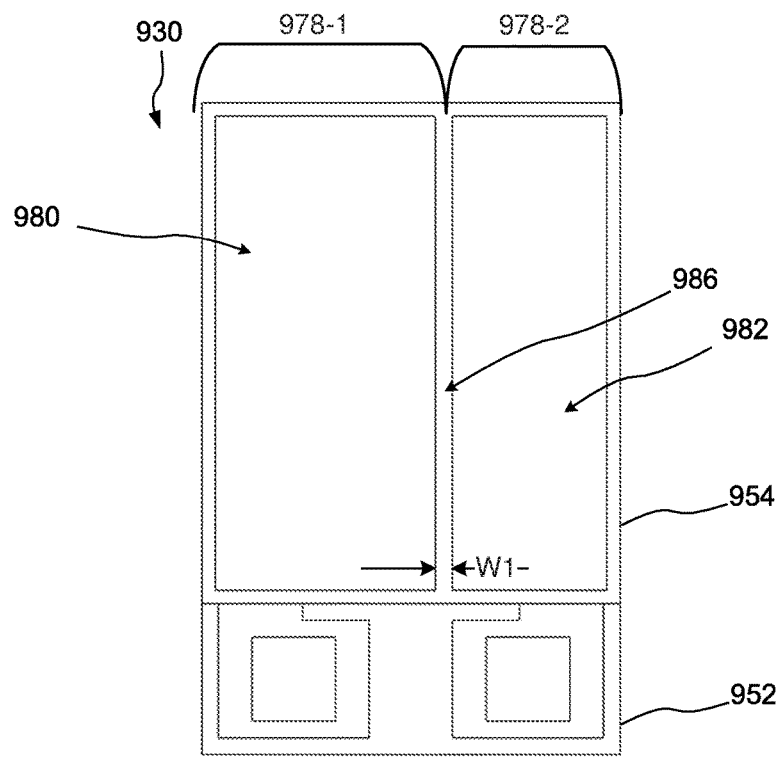
FIG. 10 shows a top view of the example thermoelectric cooler of FIG. 9, in accordance with an embodiment.

However, as shown in FIG. 10, the top plate 954 includes at least two separate and distinct component coupling sections, namely a laser coupling section 978-1 and a focus lens coupling section 978-2, that provide mounting surfaces/pads to couple to and support optical components. Note that the particular names used herein to refer to the coupling sections (i.e., laser coupling section, focus lens coupling section) are for purposes of clarity and ease of description and not for purposes of limitation. For example, the particular number of sections, the surface area and shape of those sections, and the components attached/mounted to each section can vary depending on a desired configuration.

In any event, the present disclosure has identified that keeping at least one section of a TEC thermally-isolated from other sections(s), e.g., based at least in part on a gap as discussed in further detail below, allows for that thermally-isolated section to utilize an attachment process other than soldering. Thus, the thermally-isolated section can (directly) couple to components that have relatively low temperature tolerances and easily damaged by heat. As a consequence, this may prevent the use of a soldering process in the thermally-isolated section to attach/mount optical components. However, this disclosure has further identified that other attachment procedures can be utilized in the thermally-isolated section to mount/couple optical components to contact pads such as thermal epoxy. Thermal conductivity of epoxies such as thermal epoxy can be significantly less than that of the thermal conductivity of solder alloys, however, the reduced thermal conductivity does not necessarily impact performance of components such as focus lenses and other passive/active optical components.

Moreover, the use of relatively low-temperature approaches to attachment/coupling substantially maintains the layers of the contact pad(s) in a solid state, and thus by extension, substantially maintains the "flatness" of the contact pad(s) (e.g., the contact pads maintain a mounting surface that extends substantially parallel with the surface of the top plate on which the contact pad(s) is disposed). Accordingly, this allows the contact pad(s) of the thermally-isolated section to remain substantially flat/planer following soldering processes performed on other sections of the TEC, and importantly, ensures that that optical components disposed on the contact pad(s) of the thermally-isolated section remain optically aligned or otherwise disposed in a nominal orientation relative to other associated optical components mounted to the TEC and/or TOSA housing.

Figure 9:
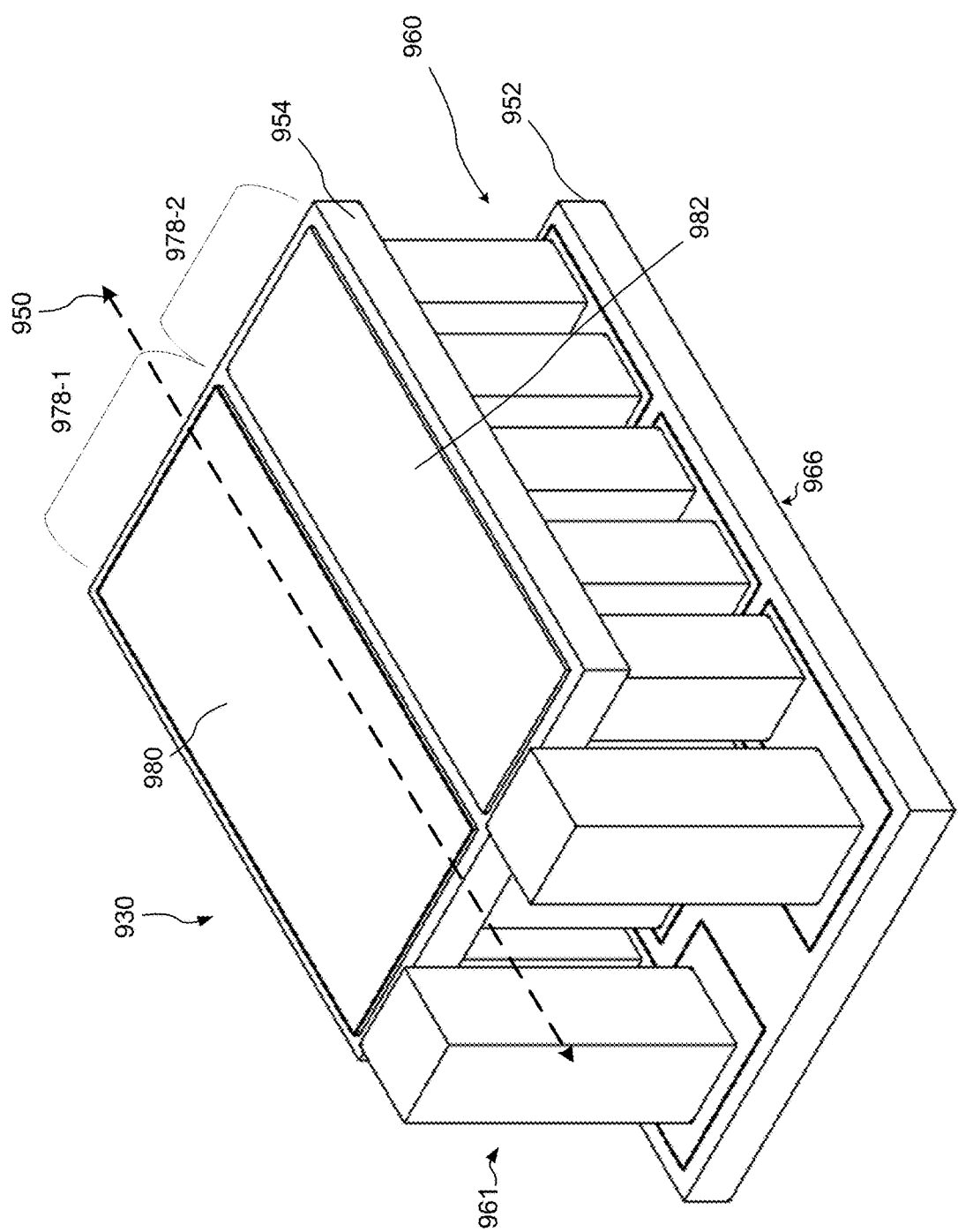
FIG. 9 shows an example thermoelectric cooler consistent with embodiments of the present disclosure.

Continuing on with reference to FIG. 9, as shown the top plate 954 includes a laser coupling section 978-1 and a focus lens coupling section 978-2. The laser coupling section 978-1 and the focus lens coupling section 978-2 extend parallel relative to each other, and parallel relative to a longitudinal axis 950 of the TEC 930. As shown, the laser coupling section 978-1 has a total surface area of the top plate 954 that is larger than a total surface area of the focus lens coupling section 978-2. However, the embodiment shown in FIG. 9 should not be construed as limiting. For instance, the total surface area of the laser coupling section 978-1 and the lens coupling section 978-2 may be substantially equal, or the focus lens coupling section 978-2 can have a total surface area that is larger than that of the laser coupling section 978-1, depending on a desired configuration.

Figure 11A:
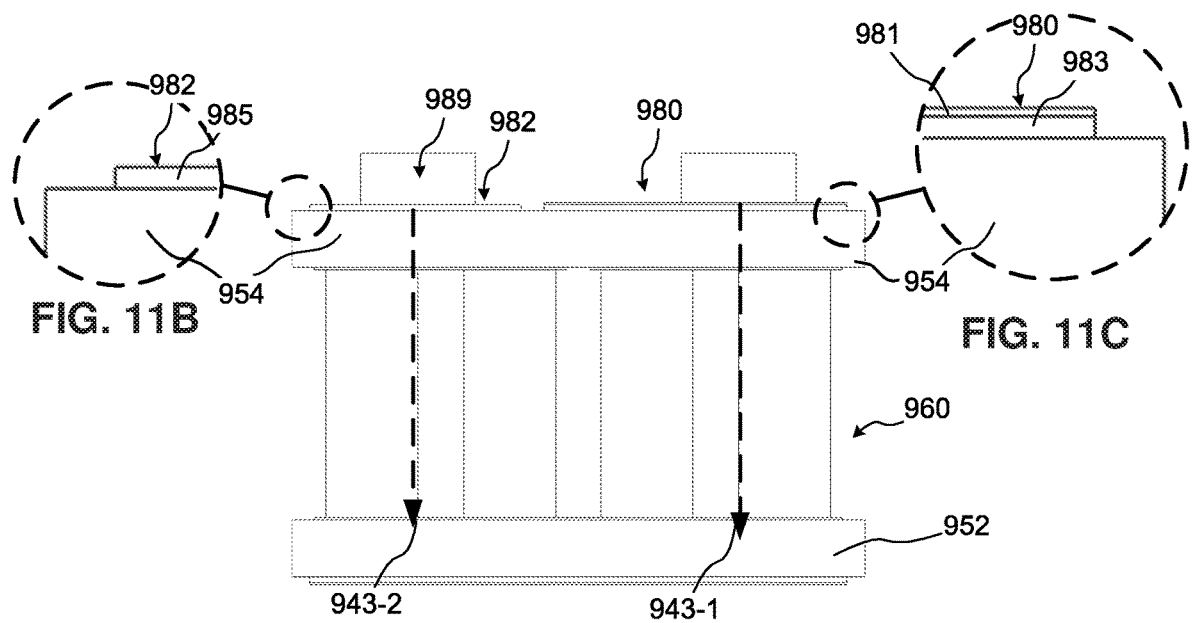
FIG. 11A shows a front view of the example thermoelectric cooler of FIG. 9, in accordance with an embodiment.
Figure 12:
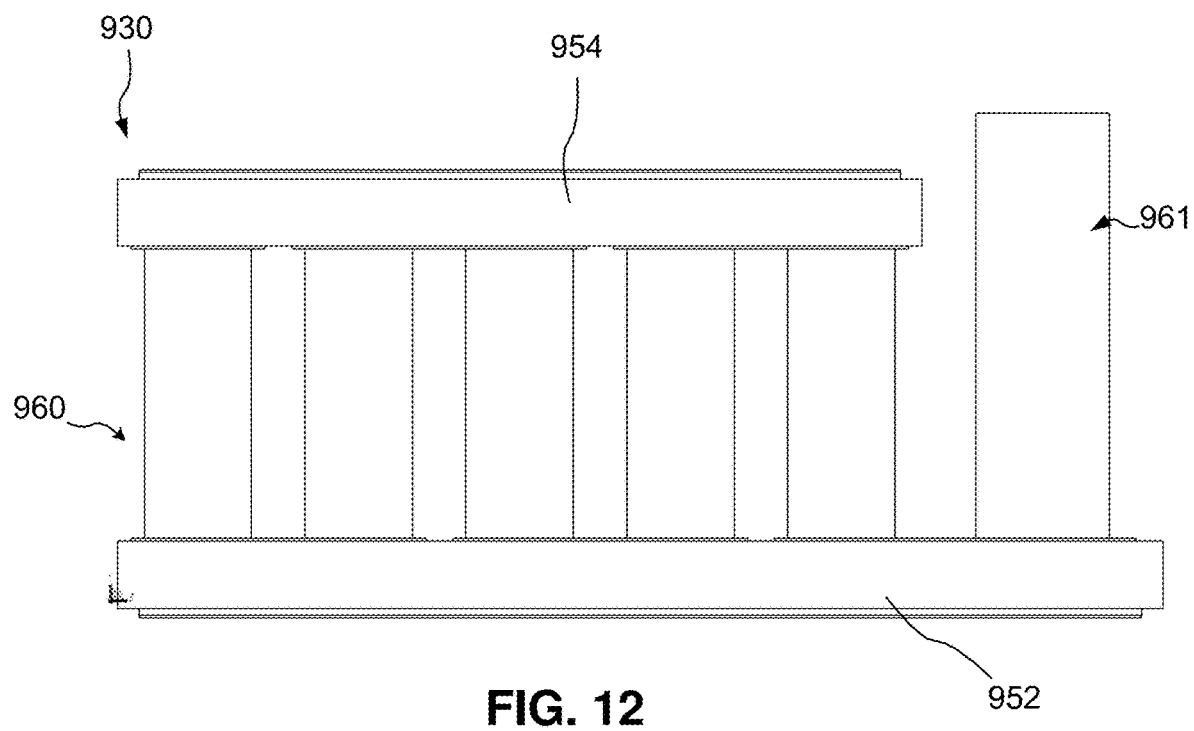
FIG. 12 shows a side view of the example thermoelectric cooler of FIG. 9, in accordance with an embodiment.

The laser coupling section 978-1 includes a layer of metallic material 983 (See FIG. 11A), which also may be referred to as a metallization layer 983 (See FIG. 11C). The layer of metallic material 983 comprises, for instance, Gold (Au), or other suitable metallization material. Preferably, the layer of metallic material comprises a material that provides at least the thermal conductivity of Gold (about 310 W/m K). The layer of metallic material 983 further includes a layer of pre-tin material 981 disposed thereon. The layer of pre-tin material 981 can comprise any suitable material for use during soldering procedures, some non-limiting example pre-tin materials include AuSn, AgCuSn, SnSb, BiSn. Formation of the layer of pre-tin material 981 can include selectively disposing the pre-tin material on to the layer of metallic material 983 via, for instance, a reflow process. Thus, the layer of metallization material 983 and layer of pre-tin 981 collectively provide a first contact pad 980 or first contact surface 980. The first contact pad 980 can couple to and support optical components such as, for example, laser diodes, monitor photodiodes, associated circuitry, discrete components such as filtering capacitors, and so on. The optical components can mount directly to the first contact pad 980 or indirectly via one or more submounts. One example submount 977 is shown below with regard to FIGS. 12 and 13.

Continuing on, the focus lens coupling section 978-2 includes a layer of metallic material 985 disposed thereon (See FIGS. 11A-11C). The layer of metallic material 985 thus provides a second contact surface/pad 982. The composition of the layer of metallic material 985 of the focus lens coupling section 978-2 may be substantially similar to the composition of the layer of metallic material 983 of the laser coupling section 978-1. In an embodiment, the layer of metallic material 985 of the lens coupling section 978-2 comprises the same material composition as the layer of metallic material 983 of the laser coupling section 978-2. The layers of metallic material 983, 985 may be disposed/epitaxially grown together or separately from each other depending on the particular process. However, the focus lens coupling section 978-2 is different from the laser coupling section 978-1 in that the laser coupling section 978-1 does not include a layer of pre-tin material disposed on the layer of metallic material 985 thus providing, in a general sense, an exposed layer of metallic material 985 that allows for coupling of optical components to the second pad 982. Accordingly, a focus lens 989 can be (directly) coupled to the second pad 982 using epoxy or other attachment approach that does not expose the layer of metallic material 985 to high-temperatures commonly used to reflow (e.g., reach eutectic temperature) pre-tin material via soldering, e.g., temperatures in excess of 183° C. As discussed below, the exposed layer of metallic material 985 is thermally insulated/isolated from the laser coupling section 978-1 to the extent that the layer of metallic material 985 maintains a substantially solid state. Thus, the layer of metallic material 985 remains substantially flat/planer for purposes of coupling and aligning the focus lens 989 with an output of an associated laser arrangement.

As further shown, a gap 986 (FIG. 10) separates the layers collectively defining the laser coupling section 978-1 and the focus lens coupling section 978-2, and more particularly the contact pads thereof. The laser coupling section 978-1 and focus lens coupling section 978-2 may also be referred to as first and second mounting sections, respectively. The width W1 of the gap 986 may be continuous (uniform), or not, depending on a desired configuration. The gap 986 may be introduced via, for instance, masking when depositing/forming the layers of each section. The gap 986 provides thermal isolation between the laser coupling section 978-1 and the focus lens coupling section 978-2. Likewise, the gap 986 provides, at least in part, substantially separate and distinct first and second thermal conduction paths 943-1, 943-2 for the laser coupling section 978-1 and the focus lens coupling section 978-2, respectively (FIG. 11A). Each of the first and second thermal conduction paths 943-1, 943-2 thermally couple components supported by the laser coupling section 978-1 and the focus lens coupling section 978-2 with a heatsink/housing by way of the bottom plate 952.

Figure 13:
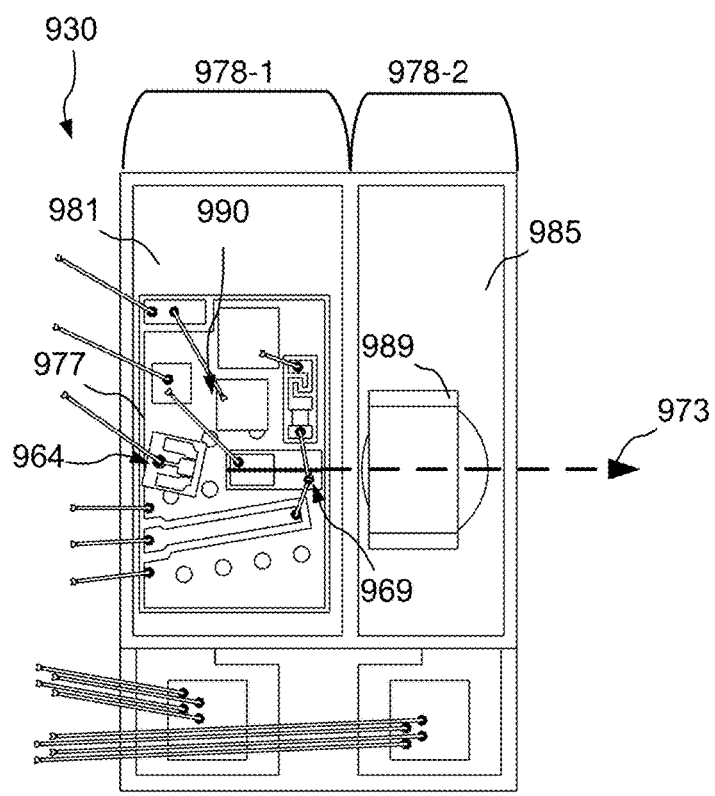
FIG. 13 shows another top view of the example thermoelectric cooler of FIG. 9, in accordance with an embodiment.
Figure 14:
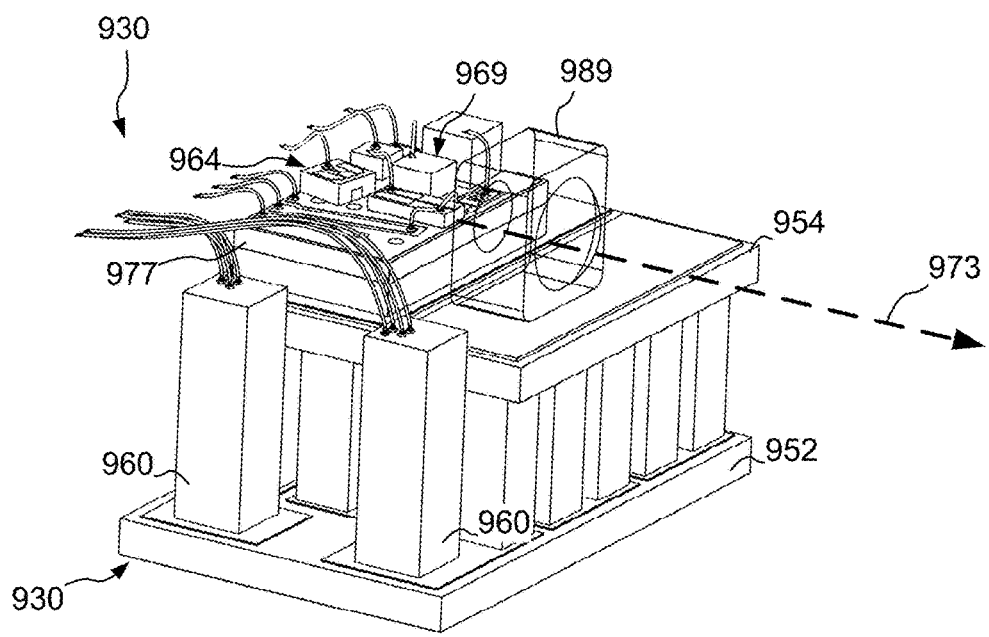
FIG. 14 shows a perspective view of the example thermoelectric cooler of FIG. 9, in accordance with an embodiment.

Turning to FIGS. 13-14, an example embodiment of a TEC 930 is illustrated in further detail. As shown, the layer of pre-tin material 981 of the laser coupling section 978-1 allows for the laser submount 977 to be soldered to the first contact pad 980 via a solder/welding process. The laser submount 977 couples to and supports a laser arrangement 990, with the laser arrangement 990 including at least a laser diode 969 and a monitor photodiode 964. As further shown, the layer of metallic material 985 of the focus lens coupling section 978-2 couples to and supports a focus lens 989. The focus lens 989 may therefore be aligned along light path 973 such that light emitted by an emission surface of the laser diode 969 intersects with the focus lens 989. The second contact pad 982 (See FIG. 11A) provided by the layer of metallic material 985 couples to the focus lens 989 via, for instance, thermal epoxy.

Figure 15:
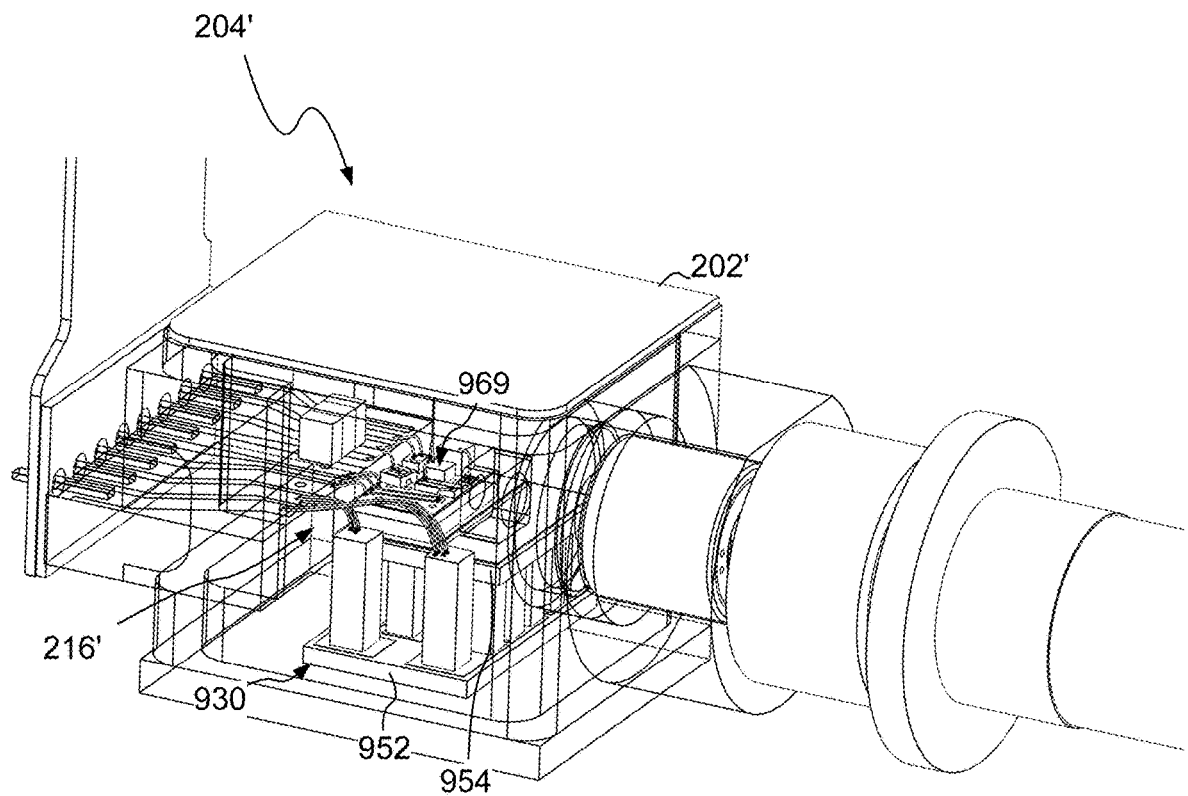
FIG. 15 shows an example transmitter optical subassembly (TOSA) implemented with the thermoelectric cooler of FIG. 9, in accordance with an embodiment.

FIG. 15 shows a TOSA module 204' consistent with an embodiment of the present disclosure. The TOSA module 204' may be configured substantially similar to the TOSA module 204 discussed above (See FIG. 2), the description of which will not be repeated for brevity. As shown, the TOSA module 204 includes a housing 202' with a cavity 216' defined by a plurality of sidewalls. The TEC 930 is mounted to and in thermal communication with a sidewall of the housing 202', thus allowing the housing 202' to operate as a heatsink. In operation, laser diode 969 then emits channel wavelengths along light path 973 to couple the channel wavelengths to a transmit fiber (not shown).

Figure 16:
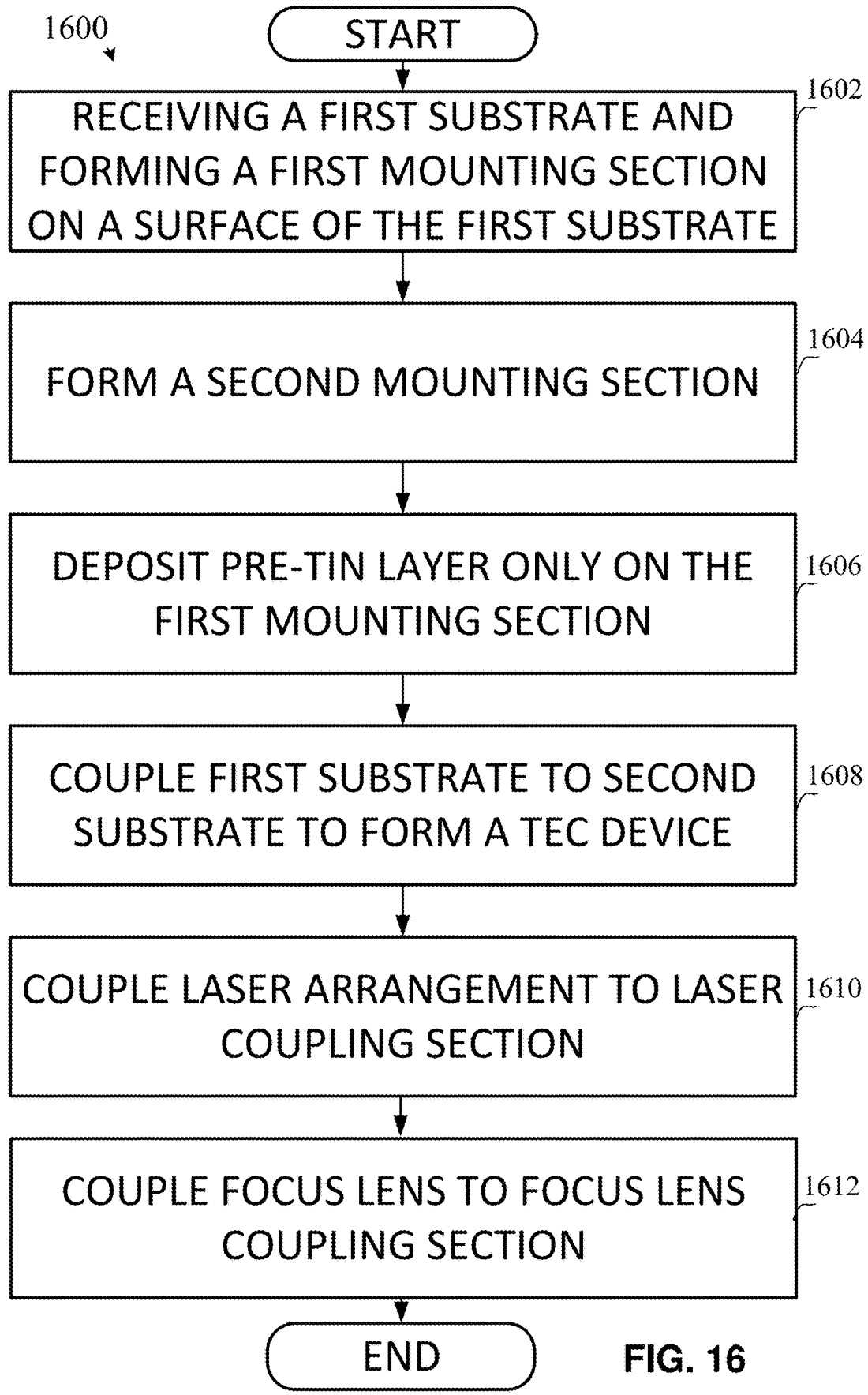
FIG. 16 is an example method for forming a thermoelectric cooler in accordance with embodiments of the present disclosure.

FIG. 16 shows one example method 1600 of manufacturing a TEC consistent with the present disclosure. Note, the example method 1600 can include additional acts, omit certain acts, and/or be performed in an order not shown in FIG. 16. The method 1600 includes receiving 1602 a first substrate and forming a first mounting section by disposing or growing a first metallization layer on a surface of the substrate. The substrate may comprise, for examine, Aluminum Nitride or Alumina. The first metallization layer may comprise, for instance, Gold or other suitable material that provides sufficient thermal communication. In an embodiment, the first metallization layer is selectively deposited/formed on the surface of the substrate such that at least a portion of the surface of the substrate does not have the first metallization layer disposed thereon.

Continuing on, a second mounting section is formed 1604 by disposing or growing a second metallization layer on the same surface of the first substrate as the first metallization layer. In an embodiment, this includes disposing the second metallization layer such that a gap is formed between the first and second metallization layers to provide thermal isolation between the two.

A layer of pre-tin material is then deposited 1606 only on the first mounting section, and in particular, only on to the first metallization layer. In an embodiment, this includes heating the first metallization layer such that the pre-tin material reflows to adhere/bond to the first metallization layer to provide a first contact pad. In scenarios where the pre-tin material comprises a tin-lead alloy, for example, this can include heating the first metallization layer up to and exceeding 188 degree Celsius to achieve reflow of the pre-tin material. However, based at least in part on the gap introduced in act 1604, the second metallization layer is at least partially thermally isolated from the first mounting section such that the heat applied to the first metallization layer does not cause the second metallization layer to reach a temperature that causes the same to reflow or otherwise lose structural integrity. In any event, no pre-tin layer is deposited on the second metallization layer to leave the same exposed and provide a second contact pad.

The method continues with coupling 1608 the first substrate to a second substrate. The first and second substrate may therefore provide a top and bottom plate, respectively. Coupling 1608 can further include disposing semiconductor elements between the first and second substrates, e.g., Pelletier elements. The first and second substrate may both be formed of the same material, e.g., Alumina, Aluminum Nitride, or the first and second substrate may be formed of different materials relative to each as discussed above. For example, the first substrate may comprise Aluminum Nitride and the second substrate may comprise Alumina. In this scenario, the first substrate provides high thermal performance, relative to the first substrate, and the first substrate can have a thermal expansion coefficient that substantially matches the thermal expansion coefficient of a heatsink or housing which the second substrate mounts to.

The method further includes coupling 1610 a laser arrangement to the first mounting section. This can include heating the pre-tin layer up to about 188 degrees Celsius to allow for soldering of the laser arrangement to the same. The laser arrangement can include a substrate such as a printed circuit board or other suitable substrate. Again, the second metallization layer remains at least partially thermally isolated, e.g., based on the formed gap, such that the exposure of the pre-tin layer of the first mounting section to heat does not cause the second metallization layer to reflow or otherwise lose structural stability.

A focus lens may then be coupled 1612 to the second mounting section, and more particularly to the second contact pad provided by the second metallization layer. In an embodiment, the focus lens may be formed from a plastic or glass. Accordingly, coupling the focus lens to the second contact pad section can include utilizing an epoxy, e.g., Silver epoxy, to bind the focus lens to the second contact pad. The second metallization layer, and by extension the second contact pad, provides a substantially flat/planer surface to mount and support the focus lens, as well as mechanical alignment of the focus lens relative to the laser arrangement and other associated optical components.

In accordance with an aspect a temperature control device for use in an optical subassembly is disclosed. The temperature control device comprising a bottom plate to couple to a heatsink, a top plate coupled to the bottom plate via a plurality of semiconductor elements disposed therebetween, the top plate providing at least first and second contact pads for coupling optical components to the temperature control device, a first optical component coupled to the first contact pad by at least one layer of solder material forming a solder joint between the first contact pad and the first optical component, and at least a second optical component coupled to the second contact pad without a layer of soldering material forming a solder joint between the second optical component and the second contact pad.

In accordance with another aspect of the present disclosure a method for forming a temperature control device for use in an optical subassembly is disclosed. The method comprising receiving a first substrate, the first substrate having a first surface for coupling to optical components and a second surface for coupling to semiconductor elements, disposing at least one layer of metallic material on the first surface of the first substrate to form a first contact pad, disposing at least one layer of metallic material on the first surface of the first substrate to form a second contact pad, disposing a pre-tin layer on the first contact pad, mounting a first optical component to the first contact pad by forming a solder joint between the first contact pad and the first optical component based on the disposed pre-tin layer, and mounting a second optical component to the second contact pad without a layer of solder material forming a solder joint between the second contact pad and the second optical component.

In accordance with another aspect of the present disclosure a transmitter optical subassembly (TOSA) is disclosed. The TOSA comprising a housing, a temperature control device disposed in the housing, the temperature control device comprising a bottom plate to thermally couple to the housing, a top plate coupled to the bottom plate via a plurality of semiconductor elements, the top plate providing at least first and second contact pads for coupling optical components to the temperature control device, a laser arrangement coupled to the first contact pad by at least one layer of solder material forming a solder joint between the first contact pad and the laser arrangement, and a focus lens coupled to the second contact pad without a layer of soldering material forming a solder joint between the focus lens and the second contact pad.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A temperature control device for use in an optical subassembly, the temperature control device comprising:
    a bottom plate to couple to a heatsink;
    a top plate coupled to the bottom plate via a plurality of semiconductor elements disposed therebetween, the top plate providing at least first and second contact pads for coupling optical components to the temperature control device;
    a first optical component coupled to the first contact pad by at least one layer of solder material forming a solder joint between the first contact pad and the first optical component; and
    at least a second optical component coupled to the second contact pad without a layer of soldering material forming a solder joint between the second optical component and the second contact pad
    wherein the first and second contact pads are substantially coplanar with each other.

2. The temperature control device of claim 1, wherein the first optical component comprises a laser arrangement, the laser arrangement including at least a laser diode, and wherein the temperature control device further comprises a laser submount that couples the laser diode to the first contact pad.

3. The temperature control device of claim 1, wherein the second optical component comprises a focus lens.

4. The temperature control device of claim 1, wherein the second optical component couples to the second contact pad via epoxy.

5. The temperature control device of claim 1, wherein the solder material forming the solder joint between the first contact pad and the first optical component comprises a tin alloy.

6. The temperature control device of claim 1, wherein the first contact pad has a larger overall surface area than the second contact pad.

7. The temperature control device of claim 1, wherein the first and second contact pads extend substantially parallel with each other and substantially parallel relative to a longitudinal axis of the temperature control device, and wherein the first and second contact pads are substantially planer.

8. The temperature control device of claim 1, wherein the first and second contact pads are separated from each other by a gap, the gap providing thermal isolation and a separate conduction path for each of the first and second contact pads through the top plate, and wherein the gap extends substantially parallel with a longitudinal axis of the temperature control device such that the gap extends lengthwise along the first and second contact pads.

9. The temperature control device of claim 1, wherein the second contact pad provides a substantially planer mounting surface, the substantially planer mounting surface extending substantially parallel with a surface of the top plate that the second contact pad is disposed on.

10. A method for forming a temperature control device for use in an optical subassembly, the method comprising:
    receiving a first substrate, the first substrate having a first surface for coupling to optical components and a second surface for coupling to semiconductor elements;
    disposing at least one layer of metallic material on the first surface of the first substrate to form a first contact pad;
    disposing at least one layer of metallic material on the first surface of the first substrate to form a second contact pad, wherein the first and second contact pads are substantially coplanar with each other;
    disposing a pre-tin layer on the first contact pad;
    mounting a first optical component to the first contact pad by forming a solder joint between the first contact pad and the first optical component based on the disposed pre-tin layer; and
    mounting a second optical component to the second contact pad without a layer of solder material forming a solder joint between the second contact pad and the second optical component.

11. The method of claim 10, wherein the method further comprises:
    receiving a second substrate, the second substrate having a mating surface for thermally coupling to a heatsink; and
    coupling the second substrate to the first substrate by way of a plurality of semiconductor elements.

12. The method of claim 10, wherein mounting a first optical component to the first contact pad further comprises heating the deposited pre-tin layer to at least a eutectic temperature associated with the pre-tin layer.

13. The method of claim 12, wherein mounting the first optical component to the first contact pad further comprises thermally isolating the first contact pad from the second contact pad to prevent the second pad from reaching an associated eutectic temperature.

14. The method of claim 10, wherein disposing the second contact pad further comprises disposing the second contact pad on the first surface of the first substrate such that a gap extends between the first and second contact pads along a longitudinal axis of the first substrate such that the gap extends lengthwise along the first and second contact pads.

15. The method of claim 10, wherein mounting a second optical component to the second contact pad further comprises disposing a layer of thermal epoxy to bind the second optical component to the second pad.

16. The method of claim 10, wherein mounting a second optical component to the second contact pad further comprises optically aligning the second optical component with the first optical component.

17. A transmitter optical subassembly (TOSA), the TOSA comprising:
    a housing;
    a temperature control device disposed in the housing, the temperature control device comprising:
    a bottom plate to thermally couple to the housing;
    a top plate coupled to the bottom plate via a plurality of semiconductor elements, the top plate providing at least first and second contact pads for coupling optical components to the temperature control device, the first and second contact pads being substantially coplanar with each other;
    a laser arrangement coupled to the first contact pad by at least one layer of solder material forming a solder joint between the first contact pad and the laser arrangement; and a focus lens coupled to the second contact pad without a layer of soldering material forming a solder joint between the focus lens and the second contact pad.

18. The TOSA of claim 17, wherein the laser arrangement includes a laser diode, and wherein the laser diode couples to the first contact pad via a submount.

19. The TOSA of claim 17, wherein the focus lens couples to the second contact pad via epoxy.

20. The TOSA of claim 17, wherein the first and second contact pads are separated from each other by a gap, the gap providing thermal isolation and a separate conduction path for each of the first and second contact pads, and wherein the gap extends along a longitudinal axis of the top plate such that the gap extends lengthwise along the first and second contact pads.

* * * * *